United States Patent [19]

Müller

[11] 3,930,855

[45] Jan. 6, 1976

[54] PROCESS FOR THE PHOTOGRAPHIC PRODUCTION OF GIVEN TRANSPARENCY OR DENSITY DISTRIBUTIONS

[75] Inventor: Reinhard Müller, Leverkusen, Germany

[73] Assignee: Agfa-Gevaert Aktiengesellschaft, Leverkusen, Germany

[22] Filed: Apr. 10, 1974

[21] Appl. No.: 459,857

Related U.S. Application Data

[63] Continuation-in-part of Ser. No. 251,966, May 10, 1972, abandoned.

[30] Foreign Application Priority Data

May 11, 1971 Germany............................ 2123265

[52] U.S. Cl. ................................. 96/27 R; 96/27 E
[51] Int. Cl.² ........................................... G03C 5/04
[58] Field of Search ........... 96/27 E, 27 R; 350/181; 355/44, 45, 51, 52, 49, 66

[56] References Cited
UNITED STATES PATENTS

| | | | |
|---|---|---|---|
| 2,995,066 | 8/1961 | Dufresse | 350/181 |
| 3,148,581 | 9/1964 | Lehmann | 350/181 |
| 3,165,969 | 1/1965 | Gunn | 355/52 |
| 3,468,230 | 9/1969 | Bellows | 355/52 |
| 3,513,308 | 5/1970 | Tajima et al. | 96/27 E |
| 3,580,660 | 5/1971 | La Russa | 350/181 |
| 3,687,543 | 8/1972 | Cochran et al. | 355/52 |
| 3,700,325 | 10/1972 | Harper | 355/52 |

OTHER PUBLICATIONS

"The Theory of the Photographic Process", 3rd Edition, pp. 482–483, Mees et al., 1966.

*Primary Examiner*—Charles L. Bowers, Jr.
*Assistant Examiner*—Edward C. Kimlin
*Attorney, Agent, or Firm*—Connolly and Hutz

[57] ABSTRACT

Photographic process for the production of density profiles or transparency profiles in photographic layers comprising the steps: determination of the characteristic curve of the emulsion layer in the usual manner, graphic determination of the brightness distribution required for the subsequent exposure on the same photographic material, producing the brightness distribution determined in stage 2 by anamorphotic optical means and exposing the photographic material making use of this brightness distribution.

5 Claims, 5 Drawing Figures

PROCESS FOR THE PHOTOGRAPHIC PRODUCTION OF GIVEN TRANSPARENCY OR DENSITY DISTRIBUTIONS

This is a continuation-in-part of application Ser. No. 251,966, filed May 10, 1972 now abandoned.

This invention relates to a process for the photographic production of distortion-free transparency or density profiles.

In many cases in the scientific and industrial fields one dimensional transparency or density distributions, such as screens for photolithography or photoengraving (also periodic rasters) are required for measuring or manufacturing purposes. Examples of pertinent screens and their applications are described in Ilford Graphic Arts Manual, pages 254–267, 268–276 and 277–284. In some cases it is sufficient for a raster or screen to have only two degrees of transparency (e.g. black and white) but distributions or periodic rasters are frequently required to have a given transparency or density profile. Generally it is not difficult to produce the rasters with two degree one dimensional transparency or density distributions but certain profiles, including those of a periodic kind, are difficult to produce by conventional means and the production of complicated profiles is quite impossible.

The production of a new dimensional brightness distribution by optical means is known. Thus, Kinder (Zeitschrift fur Instrumentenkunde (1936), 393–404) describes a number of known methods and suggests some new methods. See FIG. 260 of Mees, first edition, page 795, which shows five optical systems for obtaining graded exposures from a stepped diaphragm.

Hansen (Optik, 25 (1967), 273–278) describes a cylindrical lens arrangement with which any one-dimensional brightness distribution can be produced in a particularly well defined manner.

R. L. Lamberts and C. M. Straub, PSE, Vol. 9 (1965) page 331 ff. describe an equipment in which sinusoidal test pattern are produced by a similar variable area anamorphotic system and exposed on photographic layers for testing purposes. But because of the nonlinear characteristics of the photographic layers, the developed images are not sinusoidal density patterns. See also G. Langner and R. Müller "Evaluation of Modulation Transfer Function". This paper deals with the problem of eliminating distortions which are caused by the nonlinearity of the characteristic curve.

For industrial and scientific use, however, it is desirable and often necessary to have a material original e.g. on glass or a photographic film, either as a contact original or for making optical copies.

If a photographic layer is exposed to light, the brightness distribution of which is produced by one of the above-mentioned anamorphotic arrangements, and the layer is then developed, the density/exposure relationship determined by the characteristic curve of the photographic layer causes the transparency distribution obtained on development to be completely distorted so that it does not resemble the desired distribution and is therefore unusable.

In Mees-James, The Theory of the Photographic Process, 3. Edition, 1966, pages 482–483, the problems arising out of the nonlinearity of photographic layers are described exactly. But only the advice is given to look in data booklets on photographic films or papers to select a material that is likely to provide a close approximation of the ideal D - log E curve. In fact there exists no photographic material for which a linear relationship between brightness of exposure and density or transparency after development is given. Therefore by this way it is not possible at all to meet exactly a distinct desired density or transparency distribution.

It is an object of this invention to provide photographic processes for the production of originals and profile rasters, including both monochrome and polychrome profiles and rasters, with any given transparency distribution or any given density profile.

A photographic process for the production of density profiles or transparency profiles in photographic layers has now been found which is characterized by the following steps:

1. A photographic material containing at least one silver halide gelatin emulsion layer is exposed behind a photographic test wedge in the usual manner, the photographic properties of the layer is derived from the resultant image of the test wedge, the exposure being plotted on a linear scale along the abscissa and the transparency or density along the ordinate. For details of this exposure procedure see Mees "The Theory of the Photographic Process". The McMillan Company, New York, N.Y., U.S.A., First Edition, Chapter 19, particularly pages 773–778, in which the "exposure behind a grey step tablet" is described on pages 776 and 777 and in FIGS. 2 and 9 on pages 777.
2. On this graph, the desired transparency or density distribution is plotted as a function of the auxiliary space coordinate X and this distribution is reflected onto the characteristic curve obtained in Stage 1 to determine the brightness distribution required for the subsequent exposure on the same photographic material.
3. The brightness distribution determined by reflection in Stage 2 is produced by suitable anamorphotic optical means and
4. This brightness distribution is used for exposing the same photographic material and the material is then developed with the same developer which was used for developing the photographic material in Stage 1 and then photographically processed in the usual manner.

In contrary to the advice in "Mees-James" to look for an approximately meeting material, which never hits exactly the desired curve, in the present process every photographic material may be used, because of the brightness distribution is converted in such a way that the desired density or transparency distribution on the photographic layer is obtained.

By the process according to the invention, the distortion which inevitably occurs due to the photographic properties of the photographic layer is substantially eliminated and the required transparency or density profile is obtained in the photographic layer.

Novel features and advantages of the present invention will become apparent to one skilled in the art from a reading of the following description in conjunction with the accompanying drawings wherein similar reference characters refer to similar parts and in which.

Figure 1:
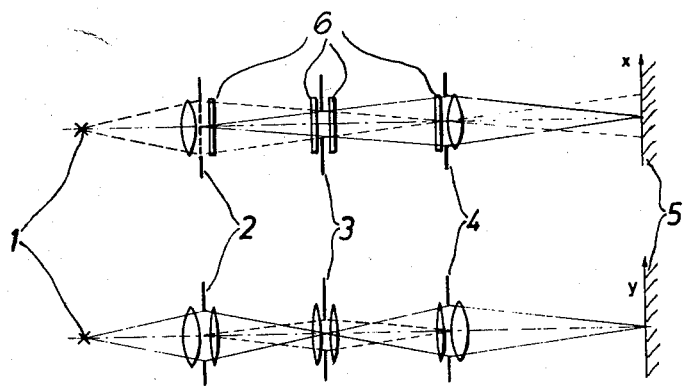
FIG. 1 is a schematic diagram of an anamorphotic optical arrangement for producing brightness distribution in accordance with this invention.

In practice the required brightness distribution is produced by use of an anamorphotic optical arrangement as shown for example, in FIG. 1. In this figure, the reference numeral 1 denotes a source of light, 2 denotes the exposure model aperture limitation arranged in the lens system to produce the required brightness distribution, 3 denotes an aperture system for adjusting the required height of profile, 4 denotes a lens system for varying the scale of the image and 5 denotes the image plane containing the photographic material on which the required brightness distribution is reflected, 6 denotes cylindrical lenses.

In this optical arrangement (FIG. 1) the cylindrical lenses 6 are orientated in such a manner to have an optical function only in the Y-section. In the X-section the cylindrical lenses are only flat glasses without an optical focusing function. Therefore in the X-section plane 2 is focused by the lens system 4 onto image plane 5. In the Y-section, where the cylindrical lenses have an optical activity, the model plane 2 is not focused on the image plane 5, but plane 2 is focused in the lens plane 4, which means it is only effective as an aperture for lens 4 which defines the brightness on the image plane 5. By this a model like FIG. 2 inserted in plane 2 effects in the X-section the image in plane 5 and the height (the Y-coordinate) of the model defines the brightness at any point of the X-coordinate. There exists a number of anamorphotic systems useful for this purpose. The system shown in FIG. 1 is only an example. Characteristically for a suitable optical anamorphotic system usable for the present process is, that the system has a plane in which one section is focused exactly on the image plane, while the other section, turned 90° in the optical axis, is only effective to the aperture of the focusing lens system.

Figure 2:
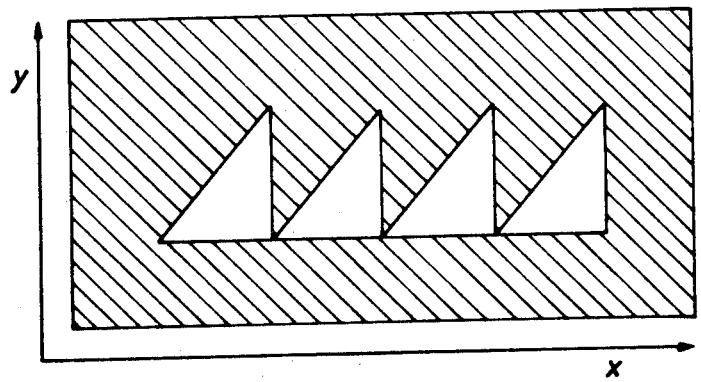
FIG. 2 is an exposure model aperture for insertion in plane 2 of FIG. 1.

The brightness distribution is determined by the design of the model 2. The brightness distribution of the image area 5 is determined by the height of the open section of the model 2 which, as can be seen in the vertical section (Y section), functions as an aperture diagram. FIG. 2 shows an example of a model for a periodic raster with a saw-toothed shaped brightness distribution. The linear rise in the Y-coordinate produces a linear brightness increase in the plane 5.

The characteristic curve of the photographic layer would normally produce a distortion so that the variation in the transparency of the layer would no longer reflect this linear rise. By the process according to the invention, the desired brightness or density distribution is obtained on the photographic layer by appropriately distorting the section cut out of the model. It is a characteristic property of photographic materials to produce images which do not exactly correspond to the original as regards the density scale between black and white. In other words there is no exact linearity between exposure and density (taking as a basis a linear scale and not a logarithmic scale; see e.g. Mees, First Edition, page 166, FIG. 61). This distortion is eliminated by steps 1–4 described on page 4 of this specification. On exposing the photographic material in accordance with step 4, the exposure is distorted in such a way that the above mentioned distortion, which is characteristic for the photograpic material, is compensated. The result is a reproduction exactly in accordance with the original.

Figure 3:
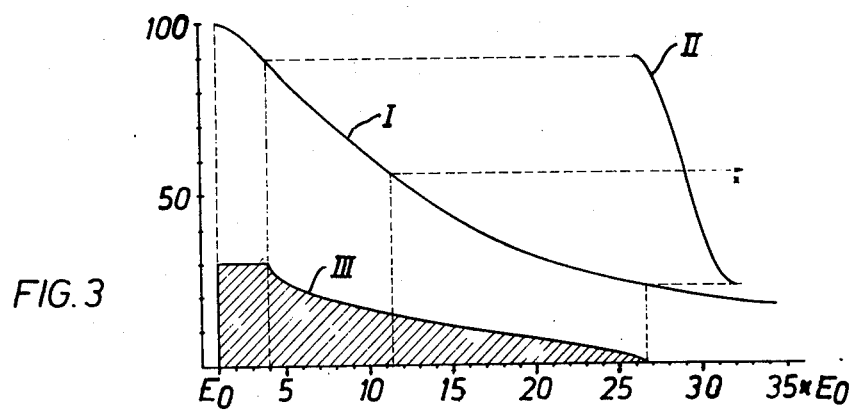
FIG. 3 is a graph illustrating the graphic method of determining the required brightness distribution in accordance with the process of this invention.

FIG. 3 shows stage 2 of the process of the invention, i.e. the graphic method of determining the required brightness distribution. In FIG. 3, the transparency in percent is plotted along the ordinate against the exposure E along the abscissa. Curve I shows the characteristic curve of the photographic material and Curve II a sinusoidal half period (transparency profile with modulation $m = 0.6$; modulation is defined as amplitude divided by average transparency). Curve II is reflected on Curve I. The required brightness distribution is obtained from Curve III. The exposure model used in the anamorphotic optical arrangement is represented by the shaded area for half a period.

To produce a periodic raster with a given profile, all that is required is to convert one period into the exposure profile (curve III of FIG. 3), duplicate this model shape photographically to the required number of periods and adjust it to a suitable size for the apparatus. In FIG. 3 Curve I represents the characteristic curve of the photographic material, Curve II the desired transparency distribution curve of the required final raster and the shaded area delimited by Curve III represents the (transparent) model to be inserted in plane 2 of the anamorphotic system of FIG. 1. The diapositive may itself be used as model 2. After exposure in the image plane 5, a one-dimensional line raster of the required profile is obtained, the height of which is determined by the aperture boundary 3 and the scale of magnification of the lens system 4 (Y section) of the optical arrangement of FIG. 1.

Any photographic material with the conventional arrangement of layers may be used for the process according to the invention. Both black and white photographic materials and colour photographic materials with one or more layers are suitable. It is preferable to use photographic materials which contain at least one silver halide emulsion layer with a gamma value of between 0.6 and 3.0. The only essential feature is that the photographic material used for the production of the transparency or density profile must have the same characteristic curve as that determined for the brightness distribution. It is, of course, preferable to use the same photographic material as that used for determining the brightness distribution. The photographic process itself is also not restricted in any way. Black and white developers may be used in the usual manner or, for the production of monochrome or polychrome transparency or density profiles, colour developers may be used. The only essential feature is that the same development process must be used for determining the characteristic curve of the photographic material and for the development of the photographic material on which the brightness distribution was reflected. The images obtained in accordance with the invention for example can be used as a pattern for making a transparent step wedge, a so called test wedge, which commonly is used for measuring the sensitivity of photographic materials. Other possibilities of use are standardized rasters of all kinds or other patterns for measuring or control equipment, further arrangements for controlling the brightness of light or photometric devices wherein grey wedges are used.

EXAMPLE 1

It is required to obtain a linear raster with sinusoidal transparency distribution with 10 periods and a period length of 2 mm. The depth of modulation of the raster should be 0.6 i.e. the maximum transparency must be 4 times the minimum transparency. For reproducing model 2 preferably a steep working photographic material is used. Suitable for example are photographic films having "Lith" type emulsions. Lith emulsions have a very short toe and can be developed to a very high gamma. Photographic materials of this sort are usual in the graphic art. Model 2 is a transparency (slide). The resultant image is a photographic image (in the present case a transparency) which contains the desired corrections. The above-mentioned linear raster can be used for testing purposes in equipment described in G. Langner and R. Müller "Evaluation of the Modulation Transfer Function of Photographic Materials", The Journal of Photographic Science, vol. 15, 1967, Chapter 2.1, page 1.

As recording material a photographic material with a fine grained silver bromide gelatin emulsion layer is used, which has a widely variable gamma value when processed in the developer described below.

The bath used for development has the following composition:
 750 ml of water,
 1 g of sodium polyphosphate,
 1 g of the sodium salt of ethylene diaminotetracetic acid,
 90 g of sodium sulphite sicc.,
 12 g of monomethylparaamidophenol sulphate,
 9 g of sodium metabisulphite and
 Water up to 1000 ml; pH 7.2.

One part of this solution is diluted with 5 parts water. The development time is 15 minutes, the development temperature 20°C.

Since a given transparency distribution is required, the characteristic curve of this photographic material is determined for the given development process in known manner and plotted as transparency against exposure (FIG. 3, film fog equal to transparency 1.0). The required sinusoidal variation of transparency is entered over the auxiliary coordinate X so as to obtain the modulation 0.6 ($\tau_{max} = 0.9$, $\tau_{min} = 0.225$). The sine curve is reflected on the characteristic curve and converted into the required exposure curve E over the auxiliary coordinate X. The exposure $E_o$ is the threshold exposure and is used as the unit for the exposure axis. The shaded area in FIG. 3 is the aperture model 2 for a half period of the raster, which is converted by the above-mentioned step in such a manner that the distortion caused by the nonlinearity of the characteristic curve of the photographic layer in use (exposure versus transparency) is corrected exactly. This model is reproduced tenfold in known manner, e.g. photographically, and reduced in scale to such an extent that by taking in account the scale of the plane 2 of the X-section containing the model, the length of a period in the image plane 5 of the optical apparatus will be 2 mm. The shaded area in FIG. 3 must be transparent and the surroundings opaque.

Figure 4:
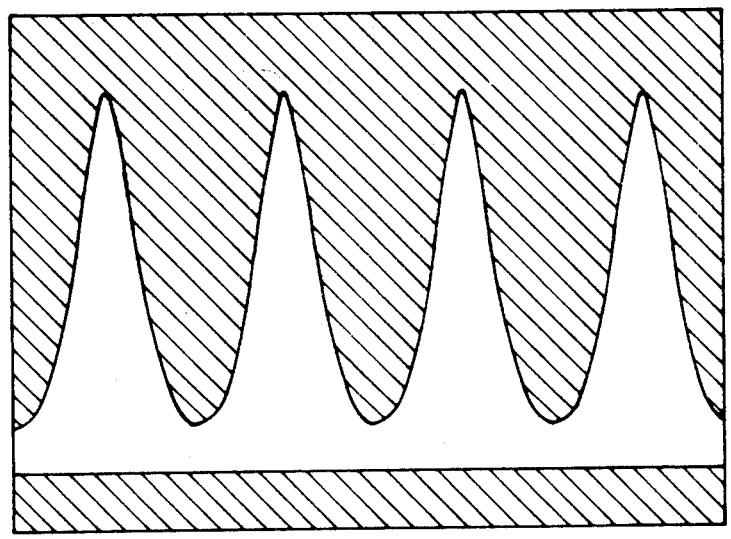
FIG. 4 shows the corrected exposure model obtained from the graphic determination shown in FIG. 3.

When finished, the model 2 (shown with only 4 periods in FIG. 4) is inserted in the apparatus and the photographic film in the image plane is exposed so that after the given development the transparent maxima of the sinus raster will have the transparency value 0.9 (above the fog). The sinusoidal raster exactly fulfils the required conditions. FIG. 4 is identical with model 2, except that only four periods are shown instead of ten. As regards the brightness, the result corresponds to the model. The white (unshaded) peaks represent the brightest areas on image plane 5, and the shaded peaks (or white valleys) correspond to the darkest area on the image plane 5.

EXAMPLE 2

It is required to obtain a periodic line raster with saw-toothed shaped density rise up to a density of 3.0 above fog.

The saw-tooth section shown in FIG. 2 would only produce a linear brightness rise in the image plane 5, and moreover this linear rise would be distorted by the characteristic curve.

The same material is used as in Example 1. It is developed in a developer of the following composition:

| | |
|---|---|
| p-methylaminophenol | 7.5 g, |
| sodium sulphite | 40.0 g, |
| hydroquinone | 3.5 g, |
| sodium carbonate | 30.0 g, |
| potassium bromide | 3.0 g, |
| water | 1000 ml. |

One part of this solution is diluted with 7 parts water. The development time is 5 minutes, the development temperature 20°C.

Figure 5:
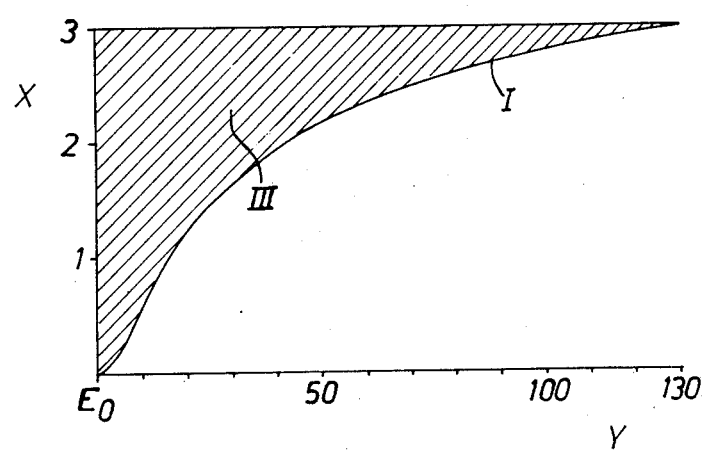
FIG. 5 shows the characteristic curve of the photographic material determined by the process of this invention with density plotted along the ordinate X against exposure E plotted along the abscissa Y.

Since a given density distribution is required, the characteristic curve is determined for the given combination of film and developer in known manner and plotted as density against exposure (in FIG. 5 the density of the film fog has been substracted). The required linear density rise above an auxiliary coordinate X up to a density of 3.0 is the straight line whose reflection on the characteristic curve I represents just this characteristic curve (density against exposure E). The shaded area III in FIG. 5 represents the model 2 which when used in the optical arrangement produces a linear density rise on the photographic film in the image plane 5.

As described in Example 1, this model is duplicated in known manner to produce the required number of periods and the transparent model is then produced on an opaque background in a suitable size.

The photographic material is exposed through this model and developed. A periodic saw-tooth raster with the required profile is obtained.

If desired, any multi-coloured profiles and rasters can be produced by exposing a colour photographic material several times in succession to light of different colours through different models and then developing the material by a chromoganic development process. If desired, one or more of the exposures may be carried out with the colour film rotated 1 or more times in the image plane 5 about any angle to the optical axis of the apparatus so that two-dimensional, multiaxial multi-coloured profiles or raster are obtained.

The characteristic curve must be determined for each given process step and each of the different exposures to coloured light.

I claim:

1. Photographic process for the production of density or transparency profiles in photographic layers, characterized by the following stages:
 a. a photographic material containing at least one silver halide gelatin emulsion layer is exposed behind a photographic test wedge in the usual manner, the exposed photographic material is developed to produce a resulting image, the curve characterizing the photographic properties of the layer is deduced from the resulting image of the test wedge, the exposure being plotted along the abscissa on a linear scale and transparency or density along the ordinate;

b. on this graph, the required transparency or density distribution is entered as a function of the auxiliary space coordinate X and this distribution is reflected on the characteristic curve obtained in Stage (a) to determine the brightness distribution required for subsequent exposure on the same photographic material;

c. the brightness distribution obtained by reflection in Stage (b) is produced by suitable optical anamorphotic means in which the image plane along the auxiliary space coordinate X is substantially unfocused whereby it defines substantially only brightness and d. to produce an image by using the obtained brightness distribution in the geometric shape of the desired profile on the same photographic material of stage a which is then developed with the same developer as that used for developing the photographic material in stage (a).

2. Process according to claim 1, characterised in that the exposed photographic material for producing coloured raster profiles is processed by a dye incorporation colour development process.

3. Process according to claim 1, characterized in that colour photographic materials are exposed to coloured light in the anamorphotic apparatus and then coloured developed.

4. Process according to claim 3, characterised in that repeated exposures are carried out with differently coloured lights and different models.

5. Process according to claim 4, characterised in that after each exposure to a coloured light, the photographic material is rotated through a certain angle around the optical axis of the anamorphotic apparatus.

* * * * *

UNITED STATES PATENT AND TRADEMARK OFFICE
CERTIFICATE OF CORRECTION

PATENT NO. : 3,930,855

DATED : January 6, 1976

INVENTOR(S) : Reinhard Muller

It is certified that error appears in the above—identified patent and that said Letters Patent are hereby corrected as shown below:

Column 1, line 28, change "new" to -- one --

Signed and Sealed this fourth Day of May 1976

[SEAL]

Attest:

RUTH C. MASON
Attesting Officer

C. MARSHALL DANN
Commissioner of Patents and Trademarks